March 17, 1964 G. T. CULBERTSON 3,125,707

TIME DELAY CIRCUIT

Filed Aug. 24, 1960

INVENTOR.

GEORGE T. CULBERTSON

BY

Owen & Owen

United States Patent Office 3,125,707
Patented Mar. 17, 1964

3,125,707
TIME DELAY CIRCUIT

George T. Culbertson, Gardena, Calif., assignor to Theodore W. Hallerberg, Los Angeles, Calif.

Filed Aug. 24, 1960, Ser. No. 51,550
10 Claims. (Cl. 317—142)

This invention relates in general to time delay devices and is more particularly directed to circuitry utilizing double-base diodes to control the timing function of electrical load energizations.

To assist in the explanation of my invention, a "double-base diode" is understood as comprising a semi-conductor device generally having an "N" type semi-conductor bar with two ohmic base terminals and a "P" type emitter electrode. The device is preferably formed of silicon to increase its temperature stability. If the interbase potential is maintained constant by a fixed potential source applied across the base terminals, the emitter voltage may be used to control the conduction of the bar. When the device is in a cut-off state, the emitter to base one PN junction is reverse biased. If the emitter potential is then sufficiently increased to overcome this bias, "holes" are injected into the bar and towards the base one by the field potential applied to the bar. The double-base diode, sometimes called a unijunction transistor, then enters its negative resistance region and the emitter current increases rapidly until limited by the potential of the emitter source.

A time delay circuit herein described utilizes the mentioned unique characteristics of a double-base diode. Accordingly, one of the objects of this invention is to provide a time delay circuit wherein the potential applied to the emitter of a double-base diode is used to control the delay period.

In my prior application Serial No. 7,410, filed February 8, 1960, and assigned to the same assignee as this present application, the unique characteristics of a double-base diode are used in a time delay circuit with an output relay winding in the emitter to base one path. There are certain applications where the current and voltage requirements of the output load may more suitably be furnished by a further circuit controlled by the double-base diode. Accordingly, one of the objects of the present invention is to isolate the output load from the emitter circuit of the double-base diode.

Another object of the invention is to provide an accurately controlled time delay device utilizing the reliable characteristics of a double-base diode.

A further object of the invention is to provide a time delay device which is relatively insensitive to line voltage variations and ambient temperature conditions.

In prior time delay systems, particularly those of the class of thermal timers, once the unit is cycled, a waiting period for the unit to reach equilibrium is necessary prior to the initiation of a second timed delay period. This disadvantage is obviated in the present invention where very rapid recycling is possible. Therefore, another object of this invention is to provide a time delay circuit in which rapid recycling with repeatable cycle periods is available.

A further object of this invention is to utilize a transistorized flip-flop device for energizing an output load when set under control of the timed operation of a double-base diode.

Features of novelty are to be determined from the appended claims. The invention itself, however, with its preferred organization and mode of operation as well as further objects and advantages may best be understood from the following description when read with the accompanying drawings, in which:

Figure 1:
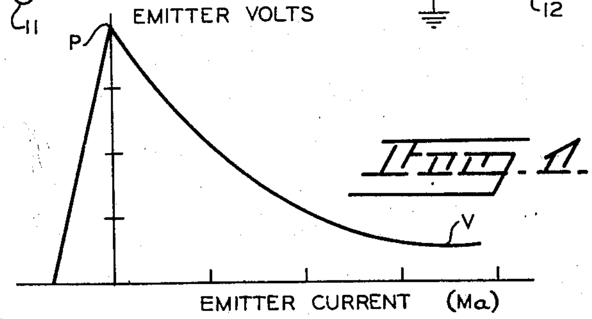
FIG. 1 shows a typical emitter voltage-current characteristic curve of a double-base diode.

In order to understand the operation of my invention, reference is made to FIG. 1 for a typical emitter characteristic of a double-base diode. It is understood that the illustrated waveform is for a double-base diode whose interbase voltage is maintained constant. A slight reverse or negative current passes through the emitter to base one PN junction to the left of the peak point P. As the emitter potential is increased to the peak point P, the PN junction between emitter and base one ohmic contact becomes biased in the forward conducting region. Between the peak point P and the valley point V, the device enters a negative resistance region. As "holes" are injected at the emitter, there is a rapid increase in conductivity at the base region. The voltage between emitter and base one decreases as the emitter current increases until it passes valley point V. To the right of this point, saturation of base one is reached and any further increase in emitter current merely provides an additional voltage drop between the emitter and base two portion of the bar.

Figure 2:
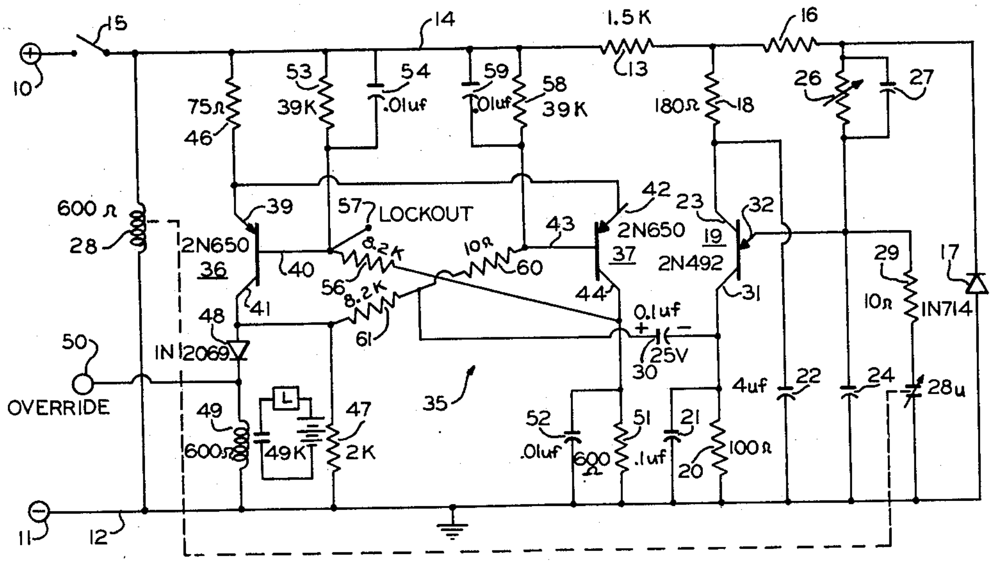
FIG. 2 shows a circuit diagram of one form of the invention.

Referring now to FIG. 2, this embodiment briefly includes a starting switch which applies line potential to a resistor-capacitor timing circuit. Once the voltage across the capacitor builds up to a predetermined amount, the double-base diode in the circuit conducts through the emitter to base one PN junction to cause a flip-flop to switch to its opposite stable state enabling an output relay to pull in. Opening of the starting switch allows the output relay to drop out preparatory to the beginning of a second timed period.

The source of line voltage which nominally is 28 volts is applied across plus and minus terminals 10 and 11. Line 12 is at a reference potential and may be considered as ground. Voltage dropping resistor 13 is in the positive line 14 beyond starting switch 15. The starting switch is illustrated as a mechanical switch although it may be the relay contacts of a control circuit or an electronic switch in a known manner. Resistor 16 has a small value of resistance and is selected to give a minimum variation in timing with line voltage changes. The resistor 16 is in series with zener diode 17 which is poled in a back biased direction and serves to regulate the voltage across the timing circuit.

Between resistors 13 and 16, a path extends to ground including temperature compensating resistor 18, transistor 19, and triggering resistor 20, shunted by capacitor 21 which absorbs circuit transients. Capacitor 22 connected from base two terminal 23 to ground also serves to minimize the effect of circuit transients by charging through resistor 18. Oftentimes, noise is present on the lines connected to terminals 10 and 11 which may take the form of either positive or negative "spikes." Without adequate account being taken of these spikes, the momentary change in potential may cause premature operation of the output circuit or change the charging rate of the capacitor towards a lower resultant voltage to lengthen the delay time. The combination of voltage regulator 17 and the transient absorbing capacitors minimize these undesired distortions.

The timing circuit includes capacitor 24 and resistor 26 which is shown as adjustable to vary the RC time constant although capacitor 24 may be an adjustable element as is well known. Capacitor 27, which is much smaller than timing capacitor 24, shunts timing resistor 26 and is chosen to provide constant firing times for transistor 19 even after long periods of inoperation. The upper end of capacitor 24 connects to emitter terminal 32 of double-base diode 19. Capacitor 24 is shunted by a discharge circuit including relay contacts **28*u* and a small valued resistor 29** which limits the current to prevent pitting of the contacts.

Flip-flop 35 is controlled by a connection from capacitor 30 which has one end connected to the line between base one terminal 31 and the top of triggering resistor 20. The flip-flop includes two PNP transistors 36 and 37 with emitter, base and collector electrodes 39, 40, 41 and 42, 43, 44 respectively. The emitters are joined together and to positive line 14 through resistor 46. Collector 41 connects to ground through resistor 47 shunting diode 48 and output relay winding 49. The diode 48 is poled in a forward direction and is preferably of a semi-conductor type. A connection to the upper end of winding 49 to terminal 50 is provided for further connection to an override positive voltage source which may selectively complete a circuit to energize relay winding 49 at any time irrespective of the control normally offered by the timing circuit. The collector 44 is connected to ground through a capacitor 52 shunting equalizing load resistor 51 which has the same resistance as that of relay 49.

The base electrode 40 of transistor 36 connects to line 14 through the parallel combination of resistor 53 and capacitor 54. Cross coupling through resistor 56 to collector 44 is furnished and a terminal 57 is provided for connection to a lockout positive voltage source which selectively maintains a bias on transistor 36 to prevent the energization of relay 49 irrespective of the control normally offered by the timing circuit. The base 43 of transistor 37 connects to line 14 through paralleled resistor 58 and capacitor 59. Cross coupled resistors 60 and 61 connect base 43 to collector 41 of the opposite transistor 36. Resistor 60 is a small valued one which limits the base to emitter current in the event the base to emitter voltage is exceeded by the pulse applied from the timing circuit through capacitor 30 joining the lower end of resistor 60.

In operation, the switch 15 is normally open, deenergizing relay 28, with the result that closed contacts **28*u* fully discharge timing capacitor 24. Switch 15 is then closed to begin the timing action by energizing relay 28 across lines 14 and 12 and opening contacts 28*u*. Zener diode 17 is poled in its back direction and acts as a high impedance across the timing circuit 26 and 24. However, whenever the voltage applied across diode 17 attempts to exceed its normal value, which may be of the order of ten volts, the diode adjusts its reverse current to regulate or maintain the voltage at a constant level. The remaining voltage is dropped primarily across resistor 13. Thus when an input voltage of varying magnitudes is applied from ground to line 14, a fixed voltage level is applied to the time constant network 24, 26**.

Capacitor 24 charges to gradually increase the potential applied to emitter 32. Transistor 19 has been in the region to the left of point P of FIG. 1 and an extremely small leakage current has been flowing in the emitter circuit. As the voltage from the emitter to base 31 reaches the value of point P, the device enters a negative resistance region and current rapidly flows through the emitter circuit moving down the curve to point V where no further discharge of capacitor 24 will occur. The emitter current flows through resistor 20 and develops a voltage which is positive five or six volts at the top of the resistor and which adds to the voltage across capacitor 30 to switch the flip-flop 35 in a manner to be described hereinafter. Capacitor 24 will then again start to charge partially through the back conductance of the diode as well as primarily through resistor 26.

The value of resistor 18 is selected to compensate for increases or decreases in the resistance from base one to base two with changes in temperature. Since the unijunction transistor has a positive temperature coefficient, an increase in temperature causes a greater voltage across the device tending to result in a longer period of time before the device fires. An appropriate selection of resistor 18 compensates for the opposite tendency of early firing of the transistor upon an increase in temperature.

This opposite effect which is balanced by the inclusion of resistor 18 may be understood from the following equation:

$$V_P = kV_{BB} + V_D \qquad (1)$$

where $V_P$ is the peak voltage P of FIG. 1, $k$ is essentially constant and is termed the intrinsic stand-off ratio, $V_{BB}$ is the interbase voltage and $V_D$ is the diode junction potential which decreases with temperature. The counteracting effects may thus be taken advantage of to assure that the peak voltage is maintained constant with varying temperature resulting in an extremely accurate time delay.

When switch 15 is closed, but prior to the firing of transistor 19, transistor 37 conducts and transistor 36 is maintained cut-off. The voltage divider including resistance 53, 56 and 51 compared to the opposite divider including resistance 58, 60, 61 and 49 shunted by resistor 47 is arranged to have the voltage on base 43 more negative than the voltage on base 40 which causes transistor 37 to conduct. When transistor 37 is conducting, it causes the voltage at emitters 39 and 42 to be the voltage across resistor 46, about the same as the voltage of collector 44. Therefore, the base 40 of transistor 36 becomes back biased by approximately the voltage drop across resistor 46 times the ratio of the values of resistor 56 divided by the sum of resistors 56 plus 53. Transistor 36 remains cut-off and insufficient current flows through output relay 49 to pull in the relay during the charging of timing capacitor 24. Meanwhile, capacitor 30 acquires a charge equal to the base 43 to the ground potential during conduction of transistor 37. Finally, when transistor 19 fires, the voltage drop across resistor 20 adds to the voltage of capacitor 30 to turn transistor 37 off. Collector 44 goes negative allowing base current to flow in transistor 36 which then becomes conductive through diode 48 to pull in relay 49. The voltage at collector 41 is utilized to back-bias transistor 37 and maintain it at cut-off thereafter until switch 15 is opened and closed a second time to recycle the time delay.

A positive potential applied to override terminal 50 may be utilized to pull in relay 49 at any time by an operator desiring to by-pass the time delay or a positive potential at lock-out terminal 57 will back-bias transistor 36 to prevent pull-in of relay 49.

Figure 3:
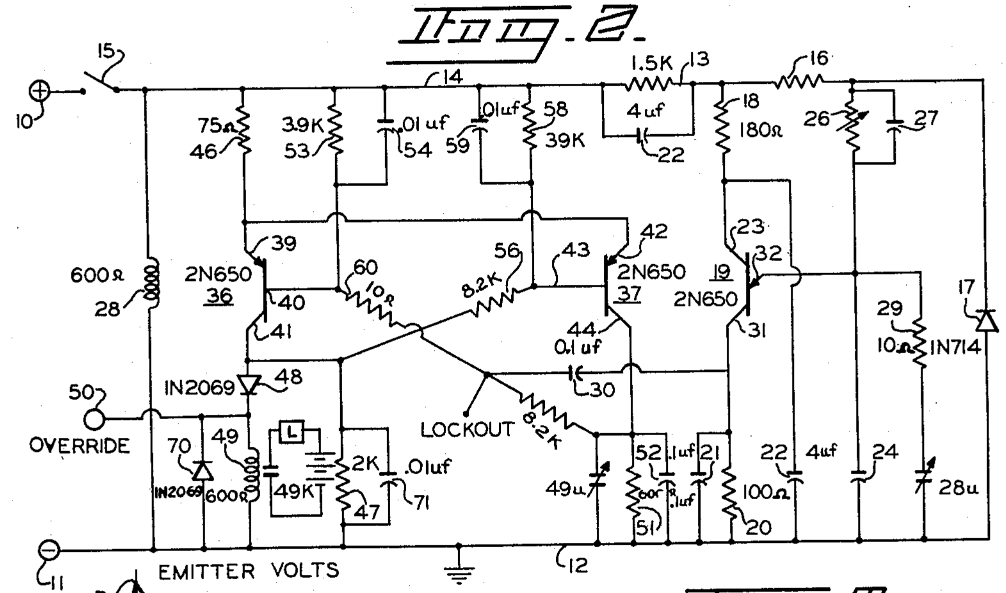
FIG. 3 illustrates a circuit diagram of another embodiment of the invention.

FIG. 3 is similar in construction and operation to FIG. 2 and similar reference numerals are used throughout. The FIG. 3 embodiment shows an alternative arrangement in which relay 49 becomes energized when switch 15 is closed and remains in this pulled-in condition until transistor 19 fires after the time period to cause relay 49 to drop out. The necessary changes include the transposition of collector to base circuits in flip-flop 35 as well as the inclusion of contacts **49*u* of relay 49 across resistor 51. Diode 70 and capacitors 71, 72** add further stability against transients.

In operation of FIG. 3, when switch 15 is first closed, transistor 36 is forward biased because of the shunting of resistor 51 by closed contacts **49*u* resulting in flow of collector current through diode 48 to operate relay 49. Contacts 49*u* are caused to open which still allows transistor 36 to conduct maintaining transistor 37 cut-off due to the potential of collector 41. The circuit remains in this condition until capacitor 24 becomes charged sufficiently to fire double-base diode 19 at which time the voltage across resistor 20 added to the charge of capacitor 30 turns transistor 36 off. Capacitor 30 has meanwhile become charged to a voltage substantially equivalent to base 40 to ground which is insufficient to back-bias transistor 36 until the voltage across resistor 20 is added thereto. Relay 49 then drops out and additional output contacts may control the timed output circuit. Transistor 37** becomes conductive, relay contacts *49u* close, and transistor 36 is kept back-biased to cut-off. The override and lockout controls operate in the same fashion as with respect to the FIG. 2 circuit.

Although the description of this invention has been set forth with respect to particular embodiment, it is not to be construed in a limiting sense. Many modifications and variations within the spirit and scope of the invention will now occur to those skilled in the art. For the extent of the invention to be covered, reference is made to the appended claims.

What I claim is:

1. A time delay circuit comprising a flip-flop having a first and a second energy translating device each with an input, output and control electrode, input switching means, means causing said first rather than said second energy translating device to conduct upon operation of said input switching means, coupling means from the output electrode of said first to the control electrode of said second energy translating device for maintaining said second device non-conducting, output circuit means responsive to the respective conduction states of said first and second devices, a timing capacitor, means for charging said timing capacitor responsive to the operation of said input switching means, a double-base diode having a first and second base electrode and an emitter electrode, means causing conduction between said emitter electrode and said first base electrode only when said timing capacitor reaches a predetermined voltage thereby causing said double-base diode to instantly enter a negative resistance region, and triggering means connected to said flip-flop and responsive to such instantaneous entry of said double-base diode into its negative resistance region causing said first and second energy translating devices to reverse their conduction states when said double-base diode conducts, said triggering means including a triggering capacitor connected to the control electrode of said first device, means charging said triggering capacitor to a voltage level below the threshold required to render said first device non-conducting, and a further voltage added in circuit with said triggering capacitor when said double-base diode conducts to exceed said threshold and control said output circuit means.

2. A time delay circuit as defined in claim 1 wherein said further voltage is developed across a resistor in the emitter to first base path of said double-base diode.

3. A time delay circuit as defined in claim 1 wherein said output circuit means includes a winding of a relay in the said input to output conduction path of one of said energy translating devices.

4. A time delay circuit as defined in claim 3 further including override control means for taking precedence over said double-base diode in the control of the condition of operation of said relay.

5. A time delay circuit comprising in combination, a double-base diode having two base electrodes and an emitter electrode, a further first and a second transistor each having an emitter, base and collector electrode, an input switching means for applying a direct current potential to said circuit, means causing said first transistor to conduit, coupling means from said first transistor maintaining said second transistor in a non-conducting condition, a resistive-capacitive timing circuit for receiving at least a portion of said direct current potential and for causing said double-base diode to instantly enter a negative resistance region thereby to conduct after a predetermined time period, output circuit means whose condition reverses under control of said predetermined time period, means causing said first and second transistors to reverse their conduction state responsive to the instantaneous conduction of said double-base diode, said last named means including a triggering capacitor connected to the base electrode of said first transistor, means charging said triggering capacitor to a voltage level below the threshold required to render said first transistor nonconducting and wherein a further voltage is added in circuit with said triggering capacitor when said double-base diode conducts to exceed said threshold and control said output circuit means.

6. A time delay circuit as defined in claim 5 wherein said further voltage is developed across a resistor in the emitter to first base path of said double-base diode.

7. A time delay circuit as defined in claim 5 wherein said output circuit means includes a winding of a relay in the said emitter to collector conduction path of one of said transistors.

8. A time delay circuit as defined in claim 7 further including override control means for taking precedence over said double-base diode in the control of the condition of operation of said relay.

9. A time delay circuit as defined in claim 5 wherein means is provided for fully discharging the capacitor of said timing circuit in response to the opening of said input switching means to prepare the circuit for a further timed operation.

10. A time delay circuit comprising in combination, a double-base diode having two base electrodes and an emitter electrode, further first and second transistors each having an emitter, base and collector electrodes, an input switching means for applying a direct current potential to said circuit, means causing said first transistor to conduct, coupling means from said first transistor maintaining said second transistor in a non-conducting condition, coupling means from said second transistor maintaining said first transistor in a conducting state, said coupling means interconnecting both said transistors including a pair of resistive bleeder networks connected across said applied direct current potential, a resistive-capacitive timing circuit for receiving at least a portion of said direct current potential and for causing said double-base diode to instantly enter a negative resistance region thereby to conduct after a predetermined time period, means causing said first and second transistors to reverse their conduction state responsive to the instantaneous conduction of said double-base diode, said last-named means including a connection from the base one electrode of said double-base diode to provide an aiding voltage to that of said bleeder network connected to said first transistor, output circuit means including a solenoid winding whose energization state reverses under control of said predetermined time period, said solenoid winding being connected in the collector circuit of said second transistor in series with a forwardly poled diode, and an override source connected between said solenoid winding and said diode of such polarity as to block said diode to isolate said override source from said transistors while selectively causing said solenoid winding to be energized.

References Cited in the file of this patent

UNITED STATES PATENTS

| | | |
|---|---|---|
| 2,845,548 | Silliman et al. | July 29, 1958 |
| 2,875,382 | Sandin et al. | Feb. 24, 1959 |
| 2,949,582 | Silliman | Aug. 16, 1960 |
| 2,970,228 | White et al. | Jan. 31, 1961 |
| 3,005,935 | Wood | Oct. 24, 1961 |
| 3,047,745 | Frank | July 31, 1962 |

OTHER REFERENCES

General Electric Transistor Manual, 4th edition, copyright 1959, page 145.